United States Patent
Tseng

(10) Patent No.: US 12,136,556 B2
(45) Date of Patent: Nov. 5, 2024

(54) SONAR SENSOR IN PROCESSING CHAMBER

(71) Applicant: Taiwan Semiconductor Manufacturing Company, Ltd., Hsinchu (TW)

(72) Inventor: Lee-Chuan Tseng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 656 days.

(21) Appl. No.: 17/376,651

(22) Filed: Jul. 15, 2021

(65) Prior Publication Data

US 2023/0019109 A1    Jan. 19, 2023

(51) Int. Cl.
| | |
|---|---|
| H01L 21/67 | (2006.01) |
| C23C 14/54 | (2006.01) |
| C23C 16/52 | (2006.01) |
| G01S 15/04 | (2006.01) |
| G01S 15/88 | (2006.01) |
| H01L 21/66 | (2006.01) |

(Continued)

(52) U.S. Cl.
CPC ...... *H01L 21/67253* (2013.01); *C23C 14/545* (2013.01); *C23C 16/52* (2013.01); *G01S 15/04* (2013.01); *G01S 15/88* (2013.01); *H01L 21/68707* (2013.01); *H01L 22/26* (2013.01); *H01L 23/544* (2013.01); *H01L 2223/54426* (2013.01)

(58) Field of Classification Search
CPC ....... C23C 14/545; C23C 16/52; G01S 15/88; G01S 15/04; H01L 21/67253; H01L 21/67259
See application file for complete search history.

(56) References Cited

U.S. PATENT DOCUMENTS

| | | | | |
|---|---|---|---|---|
| 5,240,552 | A | * | 8/1993 | Yu ........................... B24B 37/04 438/959 |
| 5,271,274 | A | * | 12/1993 | Khuri-Yakub ....... G01B 17/025 73/629 |

(Continued)

OTHER PUBLICATIONS

Wikipedia.org "Bernoulli Grip." Published on Feb. 26, 2020.

(Continued)

*Primary Examiner* — Jaehwan Oh
(74) *Attorney, Agent, or Firm* — Eschweiler & Potashnik, LLC

(57) ABSTRACT

In some embodiments, the present disclosure relates a process tool that includes a chamber housing defining a processing chamber. Within the processing chamber is a workpiece holder apparatus that is configured to hold a workpiece. A sonar sensor is arranged over the workpiece holder apparatus. The sonar sensor includes an emitter that is configured to produce sound waves traveling towards the workpiece holder apparatus. The sonar sensor also includes a detector that is configured to receive reflected sound waves from the workpiece holder apparatus or an object between the sonar sensor and the workpiece holder apparatus. Further, sonar sensor control circuitry is coupled to the sonar sensor and is configured to determine if a workpiece is present on the workpiece holder apparatus based on a sonar intensity value of the reflected sound waves received by the detector of the sonar sensor.

20 Claims, 17 Drawing Sheets

(51) Int. Cl.
*H01L 21/687* (2006.01)
*H01L 23/544* (2006.01)

(56) References Cited

U.S. PATENT DOCUMENTS

| | | | | |
|---|---|---|---|---|
| 5,812,261 | A * | 9/1998 | Nelson | G01N 29/449 |
| | | | | 356/600 |
| 9,685,362 | B2 * | 6/2017 | Adderly | H01L 21/68 |
| 9,997,385 | B2 * | 6/2018 | Adderly | G01S 15/42 |
| 10,224,225 | B2 * | 3/2019 | Adderly | G01S 15/42 |
| 2004/0189986 | A1 | 9/2004 | Chen et al. | |
| 2007/0169700 | A1 * | 7/2007 | Sniders | C23C 16/4584 |
| | | | | 118/724 |
| 2010/0013626 | A1 * | 1/2010 | Park | H01L 21/67259 |
| | | | | 118/712 |
| 2012/0307233 | A1 * | 12/2012 | Boguslavskiy | H01L 21/67109 |
| | | | | 356/43 |
| 2013/0065328 | A1 | 3/2013 | Wang et al. | |
| 2015/0235881 | A1 * | 8/2015 | Adderly | G01S 15/42 |
| | | | | 29/407.01 |
| 2017/0221742 | A1 * | 8/2017 | Adderly | H01L 21/67259 |
| 2018/0240694 | A1 * | 8/2018 | Adderly | G01S 15/42 |
| 2019/0355616 | A1 * | 11/2019 | Deng | H01L 21/67017 |
| 2021/0018473 | A1 | 1/2021 | Takemoto | |

OTHER PUBLICATIONS

Mechatronic Systemtechnik GmbH. "End Effectors." The date of publication is unknown. Retrieved online on Sep. 4, 2020 from https://www.mechatronic.at/technology/end-effectors.html.

Millipore Sigma. "Physical Vapor Deposition (PVD) Deposition process, technique & PVD materials." The date of publication is unknown. Retrieved online on Oct. 12, 2020 from https://www.sigmaaldrich.com/materials-science/material-science-products.html?TablePage=108832720.

"Reflection of Sound Waves." The date of publication is unknown. Retrieved online on Oct. 12, 2020 from https://www.simply.science/images/content/physics/waves_optics/sound_waves/Concept_map/Reflection_waves.html.

Discovery of Sound in the Sea. "Sonar Equation." The date of publication is unknown. Retrieved online on Oct. 12, 2020 from https://dosits.org/science/advanced-topics/sonar-equation/.

Arc. "Wafer Chucks." Published in 2017. Retrieved online on Oct. 12, 2020 from http://arcnano.com/wafer-chucks.

* cited by examiner

SONAR SENSOR IN PROCESSING CHAMBER

BACKGROUND

Semiconductor device fabrication is a process used to create integrated circuits that are present in everyday electronic devices. The fabrication process is a multiple-step sequence comprising deposition, photolithographic, and chemical processing steps during which electronic circuits are gradually created on a wafer. During the fabrication process, the wafer may be loaded in and out of processing chambers to carry out the aforementioned steps. Detection of the presence of the wafer within the processing chamber between steps reduces damage to each wafer and thus, the overall integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
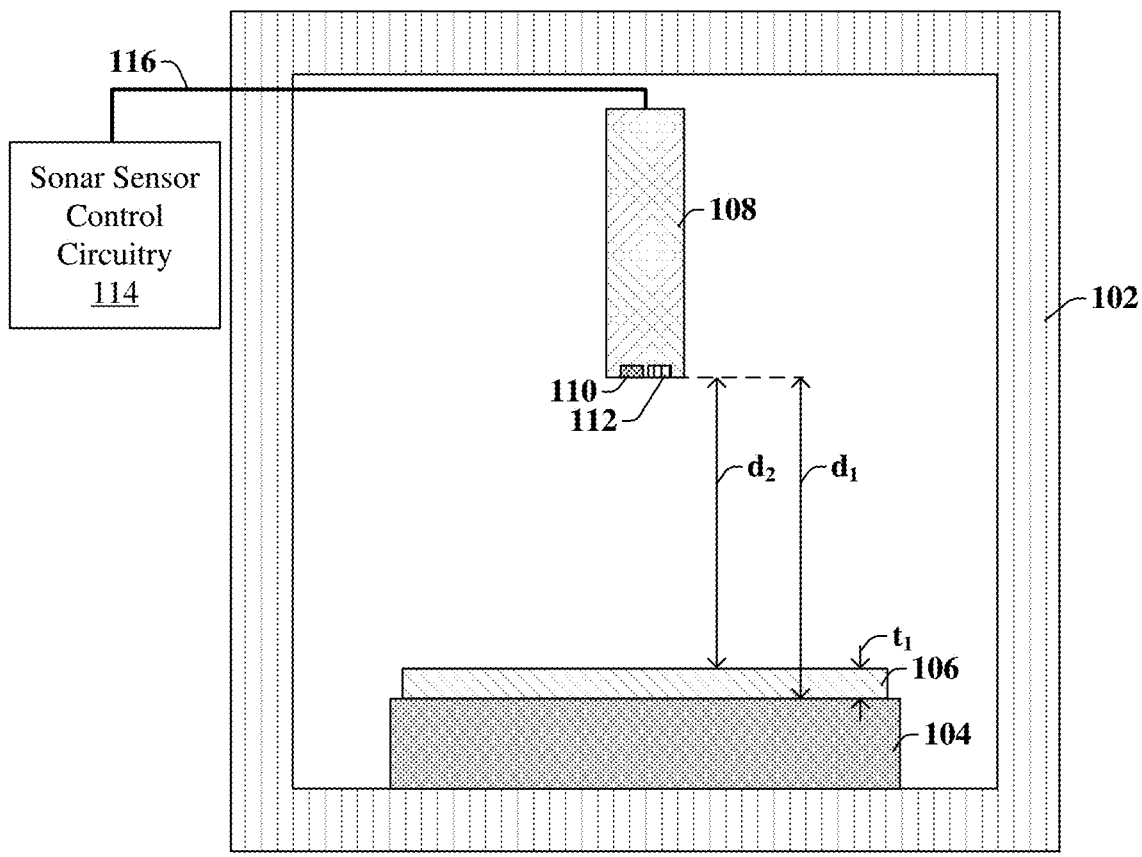
FIG. 1 illustrates a cross-sectional view of some embodiments of a processing chamber comprising a sonar sensor arranged over a wafer chuck.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, wafers are transported in and out of one or more processing chambers to conduct various processing steps such as, for example, deposition processes (e.g., chemical vapor deposition (CVD), physical vapor deposition (PVD), etc.), removal processes (e.g., etching, chemical mechanical planarization, etc.), thermal processes (e.g., annealing, etc.), photolithography processes, or the like. The wafers and/or equipment within the processing chamber such as sources for deposition processes may be monitored by detection equipment to increase the reliability of the processing steps. For example, before conducting a processing step, the presence of the wafer within the processing chamber may be determined using the detection equipment to prevent more than one wafer being from being on a same wafer chuck within the processing chamber at once. Further, for example, wafer alignment mark(s) on the wafers may be located with the detection equipment, and based on the location of the wafer alignment mark(s) on the wafer, the wafer may be aligned over on a wafer chuck within the processing chamber.

Oftentimes, the detection equipment used to monitor the wafers and/or equipment within the processing chamber comprises a light source detector. Light source detectors project light onto an object and use a camera to detect the reflected visible light from the object. Based on the reflected visible light, the light source detector may detect various features of the object, such as the presence of the object, alignment marks on the object, or defects on the object, for example. However, in some embodiments, the object to be detected by the light source detector may be transparent. For example, in electronic devices that comprise optical circuits, the optical circuits may be formed on wafers that are transparent to allow optical signals (e.g., light) to travel through the wafer. As a result, less than 1 percent of projected light on a transparent reflects from the transparent wafer. Therefore, using a light source detector that uses reflected light to detect various features of a transparent wafer is ineffective.

Various embodiments of the present disclosure relate to using a sonar sensor as detection equipment to monitor wafers and/or equipment within processing chambers. The sonar sensor may comprise an emitter configured to emit sound waves, commonly referred to as mechanical waves, and a detector configured to receive reflected sound waves.

Thus, the emitter of the sonar sensor may emit sound waves towards an object, the sound waves may reflect from the object, the detector of the sonar sensor may receive the reflected sound waves. The sonar sensor and/or sonar sensor control circuitry coupled to the sonar sensor may measure a sonar intensity value. The sonar intensity value may be converted to a distance between the sonar sensor and the object.

Thus, in some embodiments, the sonar intensity value may be used to determine whether a transparent wafer is on a wafer chuck within a processing chamber. In some other embodiments, the sonar intensity value may be used to detect a wafer alignment mark on a transparent wafer and aid in wafer alignment processes. Further, it will be appreciated that the sonar sensor may be used to detect non-transparent wafers and/or equipment within processing chambers, and therefore, the sonar sensor is more versatile than other detection equipment, such as the light source detector. Thus, by using a sonar sensor within a processing chamber, wafers and/or equipment within the processing chamber may be monitored, even if the wafers and/or equipment comprise transparent materials, to increase the reliability of the processing steps performed within the processing chambers.

FIG. 1 illustrates a cross-sectional view 100 of some embodiments of a processing chamber comprising a sonar sensor.

As shown in the cross-sectional view 100, processing chamber housing 102 encloses and defines the processing chamber. In some embodiments, a wafer chuck 104 is arranged on the bottom of the processing chamber housing 102. In some embodiments, the wafer chuck 104 may be, for example, an electrostatic wafer chuck, a magnetic wafer chuck, or any other suitable wafer chuck. The wafer chuck 104 is configured to hold a wafer 106 securely while various processing steps are conducted on the wafer 106 in the process chamber. In some embodiments, the various processing steps may include deposition processes (e.g., chemical vapor deposition (CVD), physical vapor deposition (PVD), etc.), removal processes (e.g., etching, chemical mechanical planarization, etc.), thermal processes (e.g., annealing, etc.), photolithography processes, or the like. In some embodiments, the wafer 106 comprises a semiconductor material. Further, in some embodiments, layers and/or devices may be arranged over the wafer 106. In some embodiments, the wafer 106 and/or layers or devices arranged over the wafer 106 may comprise transparent materials.

In some embodiments, a sonar sensor 108 is arranged within the processing chamber housing 102. In some embodiments, the sonar sensor 108 may be arranged near a top of the processing chamber housing 102 in the processing chamber and may be arranged directly over the wafer chuck 104. Thus, in some embodiments, the wafer 106 may be arranged between the sonar sensor 108 and the wafer chuck 104. In some embodiments, a bottom of the sonar sensor 108 is arranged at a first distance $d_1$ from a top of the wafer chuck 104, and the bottom of the sonar sensor 108 is arranged at a second distance $d_2$ from a top of the wafer 106. In some embodiments, the difference between the first distance $d_1$ and the second distance $d_2$ may be equal to a first thickness $t_1$, wherein the first thickness $t_1$ is a thickness of the wafer 106. In some embodiments, the first distance $d_1$ may be in a range of between, for example, approximately 5 centimeters to approximately 200 centimeters. In some embodiments, the first thickness $t_1$ of the wafer 106 is in a range of between, for example, approximately 100 micrometers and approximately 1000 micrometers.

In some embodiments, the sonar sensor 108 is configured to detect the presence of the wafer 106 over the wafer chuck 104. The sonar sensor 108 comprises an emitter 110 and a detector 112. The emitter 110 is configured to emit sound waves towards the wafer chuck 104, and the detector 112 is configured to receive reflected sound waves. In some embodiments, the sonar sensor 108 is coupled to sonar sensor control circuitry 114. In some embodiments, the sonar sensor control circuitry 114 may be arranged within the processing chamber housing 102, whereas in other embodiments, the sonar sensor control circuitry 114 may be arranged outside of the processing chamber housing 102. The sonar sensor control circuitry 114 may be configured to turn the sonar sensor 108 "ON" and "OFF," as well as process and determine the sonar intensity of the reflected sound waves received by the detector 112 of the sonar sensor 108, in some embodiments. In some embodiments, the sonar sensor 108 is coupled to the sonar sensor control circuitry 114 through wires 116, whereas in other embodiments, the sonar sensor 108 may be coupled to the sonar sensor control circuitry 114 wirelessly.

Because the sonar sensor 108 uses sound waves, the sonar sensor 108 may detect the presence of the wafer 106 in the processing chamber, even when the wafer 106 comprises a transparent material. Thus, the sonar sensor 108 may verify that the wafer 106 is in the processing chamber housing 102 on the wafer chuck 104 before performing processing steps on the wafer 106.

Figure 2:
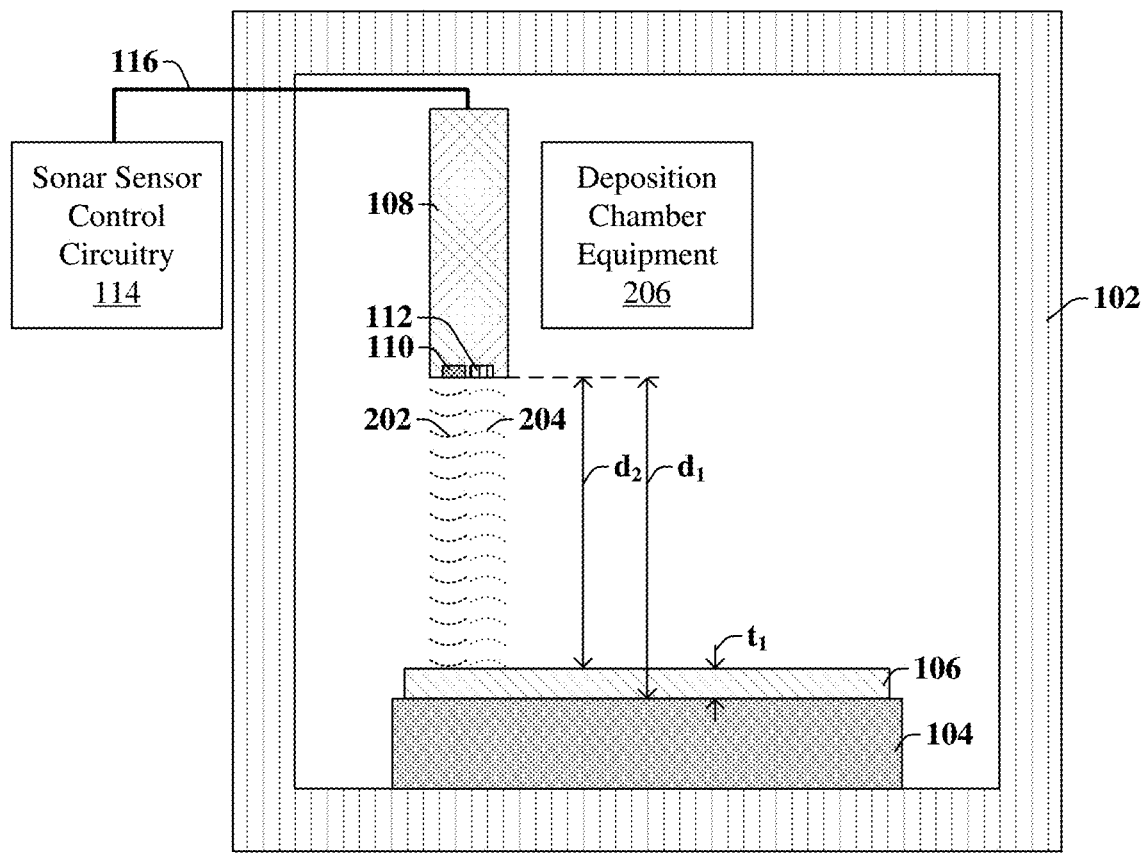
FIG. 2 illustrates a cross-sectional view of some embodiments of a processing chamber comprising a sonar sensor, wherein exemplary emitted sound waves are projected towards a wafer, the sound wavers reflect from the wafer, and exemplary reflected sound waves are received by the sonar sensor.

FIG. 2 illustrates a cross-sectional view 200 of some embodiments of the sonar sensor being operated to detect the presence of the wafer over the wafer chuck within the processing chamber.

In some embodiments, deposition chamber equipment 206 may be arranged near a top of the processing chamber housing 102. In some embodiments, the deposition chamber equipment 206 may comprise, for example, a material source for physical vapor deposition, a shower head for chemical vapor deposition, or the like. In such embodiments, the sonar sensor 108 may be arranged laterally beside the deposition chamber equipment 206. In some embodiments, the sonar sensor 108 may be arranged directly over an area of the wafer chuck 104 that is between a center and an edge of the wafer chuck 104. In other embodiments, the sonar sensor 108 may be arranged directly over a center of the wafer chuck 104 (e.g., FIG. 1).

During operation, when the sonar sensor control circuitry 114 turns the sonar sensor 108 "ON," the emitter 110 may emit emitted sound waves 202 towards the wafer chuck 104. Then, in some embodiments, the emitted sound waves 202 reflect off of the wafer 106, and reflected sound waves 204 travel towards the detector 112 of the sonar sensor 108. In some embodiments, at least 99 percent of the emitted sound waves 202 reflect off of the wafer 106 as the reflected sound waves 204. In some embodiments, the detector 112 of the sonar sensor 108 is configured to detect a sonar intensity value. The sonar intensity value may be a relative value that is based on a standard sonar baseline value. For example, in some instances, the sonar intensity value is a ratio between the intensity of the reflected sound waves 204 received by the detector 112 and the standard sonar baseline value. In some embodiments, the standard sonar baseline value is a sonar intensity detected by the detector 112 when an object is at a known distance from the sonar sensor 108. Nevertheless, the sonar intensity value detected by the detector 112 may be analyzed by the sonar sensor control circuitry 114 to determine the distance between the sonar sensor 108 and the object (e.g., the wafer 106, the wafer chuck 104, a workpiece, etc.) that the sonar sensor 108 detects through the emitted sound waves 202 and the reflected sound waves 204.

For example, in some embodiments, when the wafer 106 is not present on the wafer chuck 104, the sonar sensor 108 may be turned "ON" by the sonar sensor control circuitry 114; the emitted sound waves 202 reflect from the wafer chuck 104; the reflected sound waves 204 are received by the sonar sensor 108; and the sonar sensor control circuitry 114 measures a first sonar intensity value. The first sonar intensity value may be analyzed by the sonar sensor control circuitry 114 coupled to the sonar sensor 108 to determine the first distance $d_1$ between the sonar sensor 108 and the wafer chuck 104. Similarly, in some embodiments, when the wafer 106 is present on the wafer chuck 104, the sonar sensor 108 may be turned "ON" by the sonar sensor control circuitry 114; the emitted sound waves 202 reflect from the wafer 106; the reflected sound waves 204 are received by the sonar sensor 108; and the sonar sensor control circuitry 114 measures a second sonar intensity value. The second sonar intensity value may be analyzed by the sonar sensor control circuitry 114 coupled to the sonar sensor 108 to determine the second distance $d_2$ between the sonar sensor 108 and the wafer 106. In such embodiments, the second sonar intensity value is greater than the first sonar intensity value because the wafer 106 is closer to the sonar sensor 108 than the wafer chuck 104. Even further, in some embodiments, the difference between the first and second sonar intensity values may be used to determine the first thickness $t_1$ of the wafer 106.

In some embodiments, the sonar intensity value may be compared to a first predetermined sonar intensity value to determine whether the wafer 106 or any workpiece is present on the wafer chuck 104. For example, in some embodiments, the sonar sensor 108 may detect the first sonar intensity value; the first sonar intensity value may be compared to the first predetermined sonar intensity value; and because the first sonar intensity value is less than the first predetermined sonar intensity value, the sonar sensor control circuitry 114 may determine that the wafer 106 is not present on the wafer chuck 104. Similarly, in some embodiments, the sonar sensor 108 may detect the second sonar intensity value; the second sonar intensity value may be compared to the first predetermined sonar intensity value; and because the second sonar intensity value is greater than the first predetermined sonar intensity value, the sonar sensor control circuitry 114 may determine that the wafer 106 is present on the wafer chuck 104.

In some embodiments, the sonar sensor 108 is used between processing steps to verify that a previously processed wafer or any previously processed workpiece has been removed from the wafer chuck 104, and the wafer 106 or workpiece to be processed may be loaded onto the wafer chuck 104. Because sound waves (e.g., emitted sound waves 202, reflected sound waves 204) from the sonar sensor 108 are used to detect the presence of the wafer 106, the degree of transparency of the material(s) of the wafer 106 does not matter.

Figure 3:
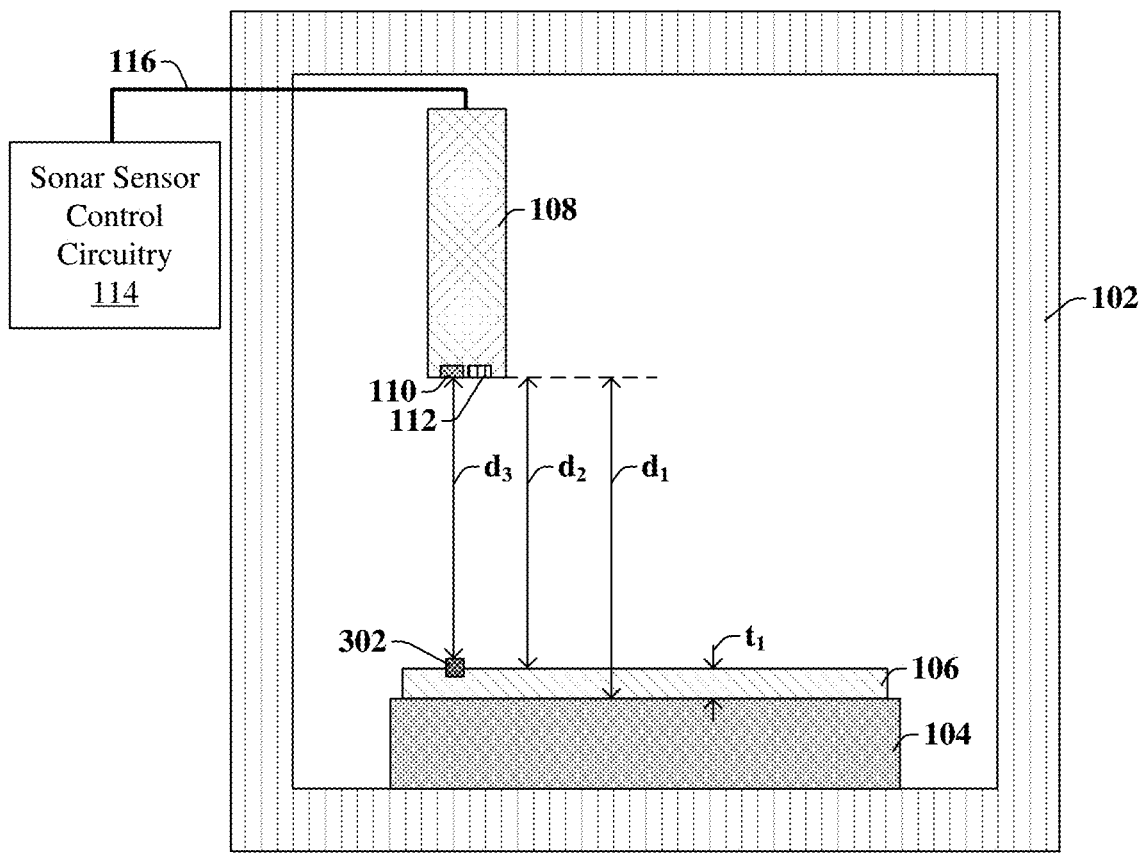
FIG. 3 illustrates a cross-sectional view of some other embodiment of a processing chamber comprising a sonar sensor, wherein the sonar sensor is configured to locate a wafer alignment mark on a wafer.

FIG. 3 illustrates a cross-sectional view 300 of some embodiments of a processing chamber comprising a sonar sensor configured to locate a wafer alignment mark on a wafer.

In some embodiments, the wafer 106 may comprise a wafer alignment mark 302 on an upper surface of the wafer 106. In some embodiments, the wafer alignment mark 302 is a different material than the wafer 106, whereas in other embodiments, the wafer alignment mark 302 is a same material as the wafer 106. In some embodiments, the wafer alignment mark 302 and/or the wafer 106 comprise a transparent material. In some other embodiments, the wafer alignment mark 302 may be a portion of the wafer 106 that was removed, such that the wafer alignment mark is defined by a surface of the wafer 106 arranged between top and bottom surfaces of the wafer 106. Nevertheless, in some embodiments, the sonar sensor 108 may be configured to detect the wafer alignment mark 302 by using sound waves to detect a third distance $d_3$, wherein the third distance $d_3$ is the distance between the sonar sensor 108 and the wafer alignment mark 302. In some embodiments, the third distance $d_3$ is greater than the second distance $d_2$. In other embodiments, wherein the wafer alignment mark 302 is defined by a surface of the wafer 106 arranged between top and bottom surfaces of the wafer 106, the third distance $d_3$ is between the first and second distances $d_1$, $d_2$.

Thus, in some embodiments, the wafer 106 may be loaded onto the wafer chuck 104, and the sonar sensor 108 may use sound waves to determine a location on the wafer 106 that has a sonar intensity value corresponding to the third distance $d_3$ of the wafer alignment mark 302. Whether or not the wafer alignment mark 302 is a same material as the wafer 106 and/or whether or not the wafer alignment mark 302 is transparent, the sonar sensor 108 can still effectively detect the wafer alignment mark 302 using a comparison between the sonar intensity values at the third distance $d_3$ versus the second distance $d_2$. After the detection of the wafer alignment mark 302 by the sonar sensor 108, an alignment process may be conducted to move the wafer 106 such that the wafer 106 is aligned over the wafer chuck 104. Thus, the processing steps to follow within the processing chamber housing 102 may be reliably performed over the aligned wafer 106.

Figure 4:
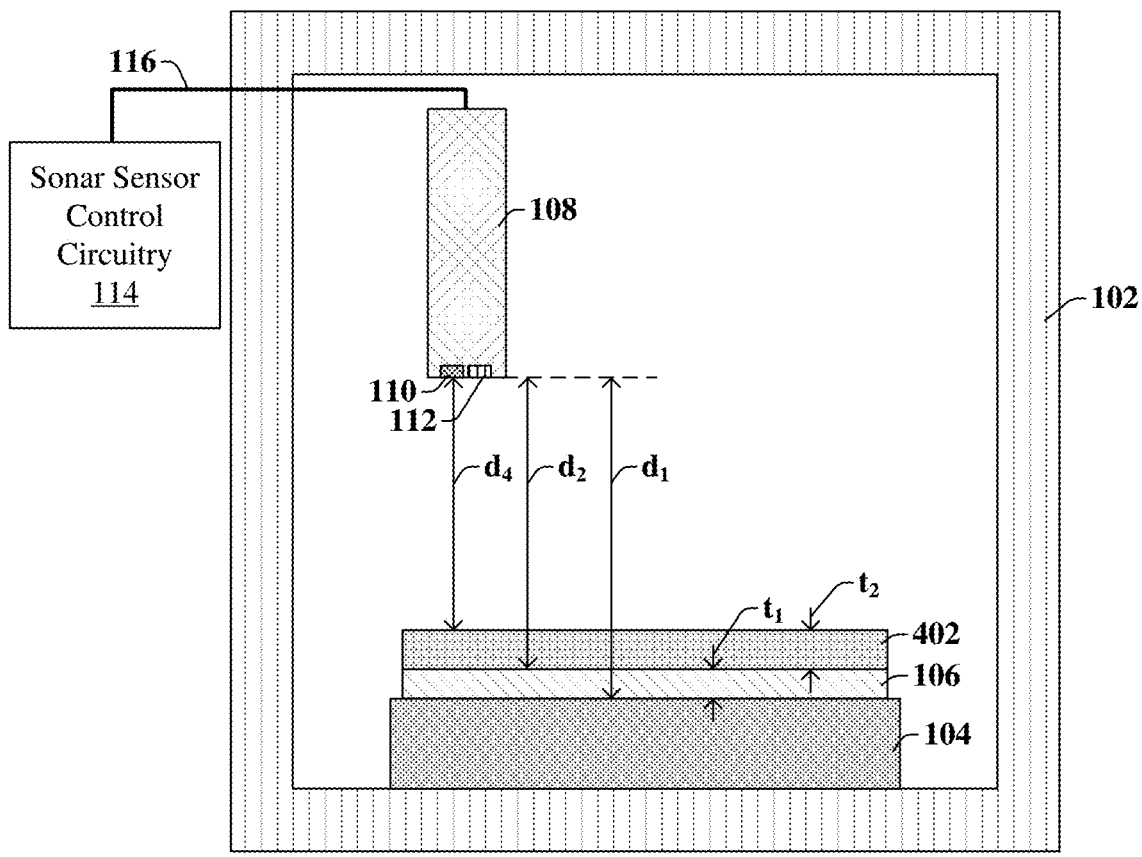
FIG. 4 illustrates a cross-sectional view of some other embodiments of a processing chamber comprising a sonar sensor, wherein the sonar sensor is configured to detect a thickness of a layer over a wafer.

FIG. 4 illustrates a cross-sectional view 400 of some other embodiments of a processing chamber comprising a sonar sensor configured to detect a thickness of a layer over a wafer.

In some embodiments, a layer 402 may be arranged over the wafer 106. In some embodiments, the layer 402 may comprise a transparent material such as, for example, silicon nitride, silicon dioxide, a polymeric material, or some other suitable transparent material. The layer 402 may have been formed over the wafer 106 by way of a deposition process (e.g., physical vapor deposition (PVD), chemical vapor deposition (CVD), atomic layer deposition (ALD), sputtering, spin-on, etc.), for example. In some embodiments, prior to the formation of the layer 402, the sonar sensor 108 may perform a second sonar measurement process to measure a second sonar intensity value associated with the second distance $d_2$ between the wafer 106 and the sonar sensor 108. Then, in some embodiments, the layer 402 may be formed over the wafer 106, and a third sonar measurement process may be performed by the sonar sensor 108 to measure a third sonar intensity value. In some embodiments, the third sonar intensity value is associated with a fourth distance $d_4$ arranged between the layer 402 and the sonar sensor 108. Thus, in some embodiments, the sonar sensor control circuitry 114 can determine that a difference between the second distance $d_2$ that corresponds to the second intensity value and the fourth distance $d_4$ that corresponds to the third sonar intensity value is equal to a second thickness $t_2$ of the layer 402.

Therefore, in some embodiments, the sonar sensor 108 may be used to determine if the second thickness $t_2$ of the layer 402 is sufficient. For example, in some embodiments, during a deposition process of forming the layer 402, the sonar sensor 108 may check to see if the layer 402 is at its desired thickness by comparing the third sonar intensity value corresponding to the fourth distance $d_4$ with a second predetermined sonar intensity value. In some such embodiments, if the measured third sonar intensity value is greater than the second predetermined sonar intensity value, the deposition process will end; whereas, if the measured third sonar intensity value is less than the second predetermined sonar intensity value, the deposition process will continue until the measured third sonar intensity value is greater than or equal to the second predetermined sonar intensity value.

In other embodiments, such as during removal processes, the sonar sensor 108 may check to see if enough of the layer 402 has been removed by a removal process (e.g., etching, chemical mechanical planarization, etc.) based on the second thickness $t_2$ of the layer 402 detected by the sonar sensor 108.

Figure 5A:
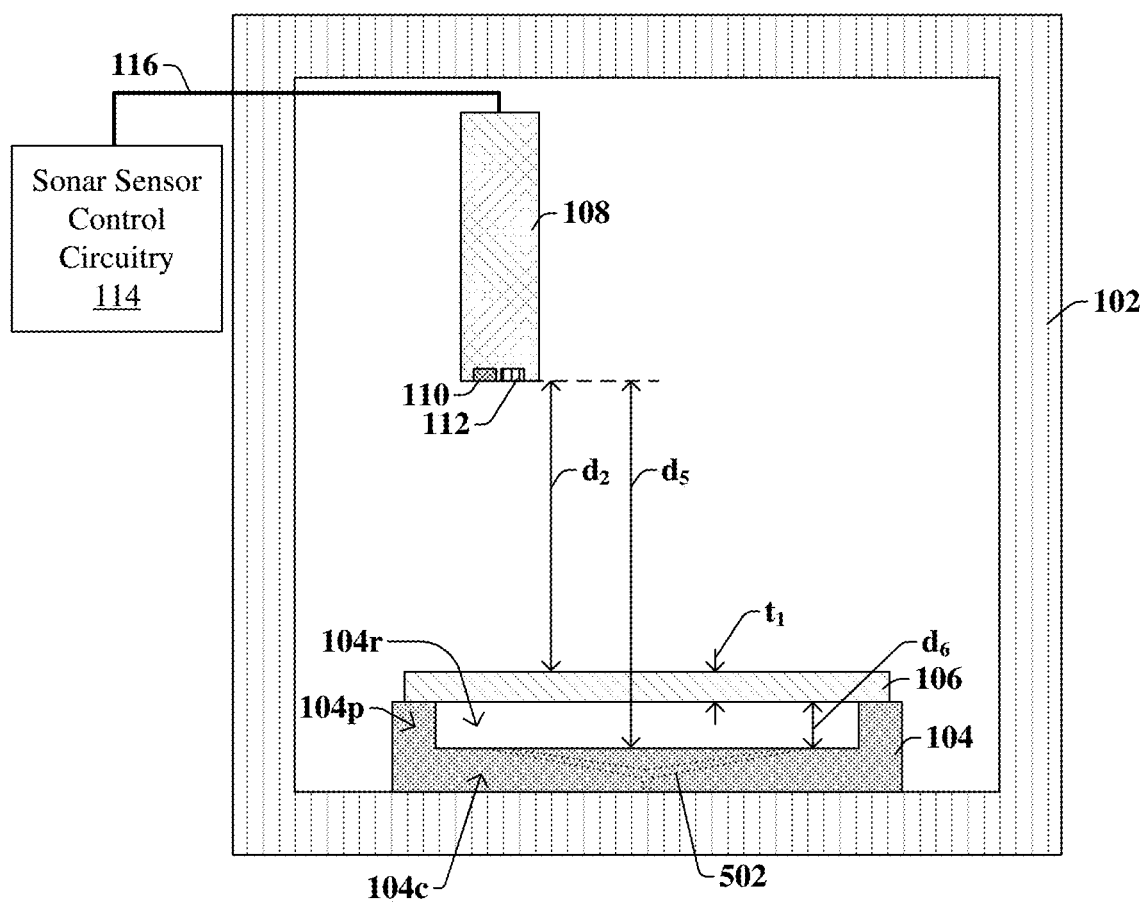
FIG. 5A illustrates a cross-sectional view of some embodiment of a processing chamber comprising a sonar sensor arranged over a wafer chuck comprising a recess.

FIG. 5A illustrates a cross-sectional view 500A of some embodiment of a processing chamber comprising a sonar sensor arranged over a wafer chuck comprising a recess.

In some embodiments, the wafer chuck 104 may comprise a recess 104r, wherein the wafer 106 directly contacts peripheral portions 104p of the wafer chuck 104 that laterally surround the recess 104r. In such embodiments, the distance between the sonar sensor 108 and a center portion 104c of the wafer chuck 104 may be as large as a fifth distance $d_5$. In some embodiments, the peripheral portions 104p protrude away from the center portion 104c of the wafer chuck 104, and the recess 104r has outer surfaces defined by the peripheral portions 104p and a lower surface defined by the center portion 104c. In some embodiments, the center portion 104c of the wafer chuck 104 may comprise piping 502 that controls air flow around the recess 104r such that the wafer 106 is secured on the wafer chuck 104 due to a difference in pressure between the recess 104r and the rest of the processing chamber. Further, in some embodiments, the sonar sensor 108 directly overlies the center portion 104c of the wafer chuck 104.

In some embodiments, the recess 104r may have a depth equal to a sixth distance $d_6$. In some embodiments, the sixth distance $d_6$ may be in a range of between, for example, approximately 1 millimeter and approximately 5 millimeters. Therefore, in some embodiments, a difference between the fifth distance $d_5$ and the second distance $d_2$ equals a sum of the first thickness $t_1$ of the wafer 106 and the sixth distance $d_6$ of the recess 104r of the wafer chuck 104. In such embodiments, when the wafer 106 is not present on the wafer chuck 104, the sonar sensor 108 may measure a first sonar intensity value that corresponds to the fifth distance $d_5$. Further, when the wafer 106 is present on the wafer chuck 104, the sonar sensor 108 may measure a second sonar intensity value that corresponds to the second distance $d_2$. Because of the recess 104r of the wafer chuck 104, a difference between the first and second sonar intensity values is greater than if the recess 104r were not present (e.g., FIG. 1). Therefore, in some embodiments, because of the sixth distance $d_6$ provided by the recess 104r of the wafer chuck 104, distinguishing the presence of the wafer 106 over the wafer chuck 104 may be easier using the sonar sensor 108 than in other embodiments wherein the wafer chuck 104 does not comprise the recess 104r (e.g., FIGS. 1-4).

Figure 5B:
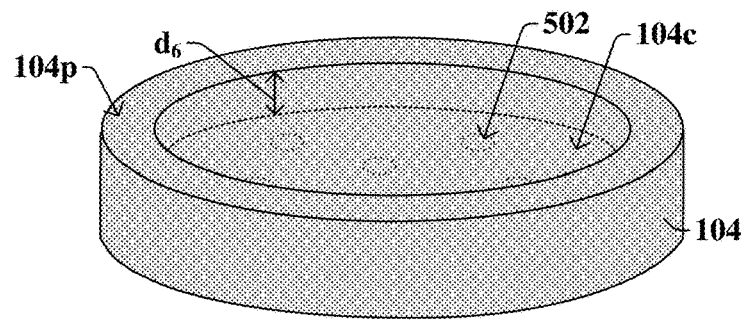
FIGS. 5B, 5C, and 5D illustrate perspective views of some embodiments of a wafer chuck comprising a recess.
Figure 5C:
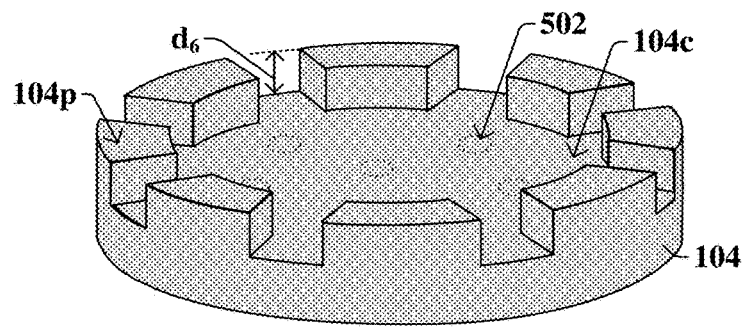
Figure 5D:
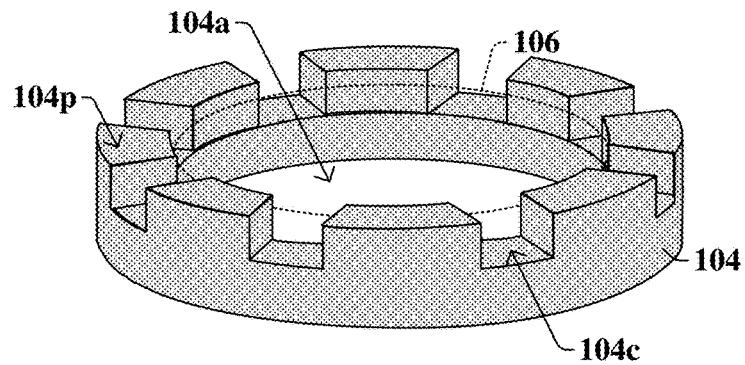

FIGS. 5B, 5C, and 5D respectively illustrate perspective views 500B, 500C, and 500D of some embodiments of a wafer chuck comprising a recess.

As illustrated in perspective view 500B of FIG. 5B, in some embodiments, the wafer chuck 104 comprises a peripheral portion 104p that is in a continuously connected, ring-like configuration. In some embodiments, the center portion 104c of the wafer chuck 104 comprises multiple openings for the piping 502. Further, in some embodiments, the peripheral portion 104p has an upper surface that is arranged at the sixth distance $d_6$ above an upper surface of the center portion 104c of the wafer chuck 104. It will be appreciated that when a wafer (106 of FIG. 5A) is present on the wafer chuck 104, the wafer (106 of FIG. 5A) would directly contact the peripheral portion 104p but would not directly contact the center portion 104c of the wafer chuck 104.

As illustrated in perspective view 500C of FIG. 5C, in some embodiments, the wafer chuck 104 comprises multiple peripheral portions 104p extending from the center portion 104c of the wafer chuck 104. In some embodiments, the center portion 104c of the wafer chuck 104 comprises multiple openings for the piping 502. Further, in some embodiments, each peripheral portion 104p may have an upper surface that is arranged at the sixth distance $d_6$ above an upper surface of the center portion 104c of the wafer chuck 104. It will be appreciated that when a wafer (106 of FIG. 5A) is present on the wafer chuck 104, the wafer (106 of FIG. 5A) would directly contact the peripheral portions 104p but would not directly contact the center portion 104c of the wafer chuck 104.

As illustrated in perspective view 500D of FIG. 5D, in yet some other embodiments, the wafer chuck 104 comprises the peripheral portions 104p that directly overlie the center portion 104c of the wafer chuck 104. In some such embodiments, the wafer 106 may be arranged between the peripheral portions 104p. In some embodiments, the center portion 104c of the wafer chuck 104 may be a continuous ring-like structure such that an opening 104a of the wafer chuck 104 is surrounded by the center portion 104c of the wafer chuck 104. In some such embodiments, the wafer 106 directly overlies the opening 104a and thus, does not directly overlie the center portion 104c of the wafer chuck 104. In some such embodiments, wherein the wafer chuck 104 comprises the opening 104a, the difference between a first sonar intensity value indicative that the wafer 106 is not present on the wafer chuck 104 and the second sonar intensity value indicative that the wafer 106 is on the wafer chuck 104 may be even larger than in the embodiments of FIGS. 5B and 5C that do not comprise the opening 104a.

Figure 6:
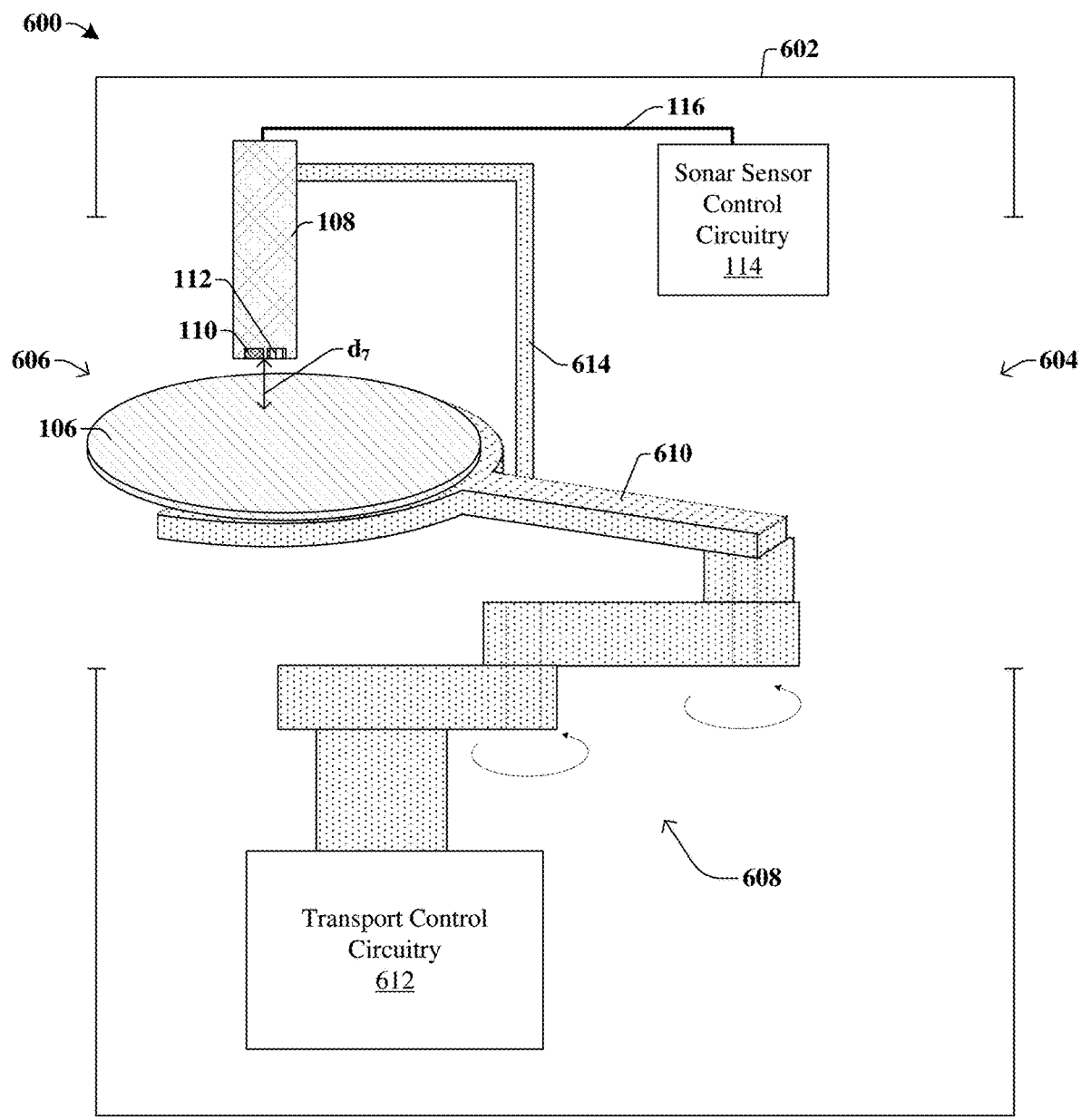
FIG. 6 illustrates a cross-sectional view of some embodiments of a tool housing comprising a sonar sensor arranged over a transport robot.

FIG. 6 illustrates a cross-sectional view 600 of some embodiments of a tool housing comprising a sonar sensor arranged on a transport robot.

The cross-sectional view 600 includes a tool housing 602 comprising a first opening 604 and a second opening 606. In some embodiments, a processing chamber (e.g., processing chamber housing 102 of FIG. 1), a storage chamber, or the like are connected through the first and second openings 604, 606 of the tool housing 602. In some embodiments, a transport robot 608 is configured to move a wafer 106 between various chambers through the first and second openings 604, 606 between processing steps. In some embodiments, the transport robot 608 comprises a robotic arm 610, is configured to move three-dimensionally, and is controlled by and coupled to transport control circuitry 612. In some embodiments, the robotic arm 610 is configured to transport the wafer 106 by resting underneath the wafer 106. In some embodiments, the portion of the robotic arm 610 that contacts the wafer 106 has an overall "U" or "V" shape to mitigate damage between the robotic arm 610 and the wafer 106 (e.g., robotic arm 610 of FIG. 9B). In some other embodiments, the robotic arm 610 is configured to securely grab onto and edge the wafer 106 without damaging the wafer 106.

In some embodiments, a sonar sensor 108 is also fixed to the robotic arm 610 to detect the presence of the wafer 106 in the transport robot 608. In such embodiments, the sonar sensor 108 may be arranged at a seventh distance $d_7$ above the wafer 106 when the transport robot 608 is transporting the wafer 106. In other embodiments, the sonar sensor 108 may be arranged on a side of the robotic arm 610 directed towards the wafer 106, or the sonar sensor 108 may be arranged below the robotic arm 610 directed towards the wafer 106. In some embodiments, the sonar sensor 108 may be configured to verify the presence of the wafer 106 during transport by the transport robot 608. For example, in some embodiments, the sonar sensor 108 and sonar sensor control circuitry 114 are configured to verify the presence of the wafer 106 in the transport robot 608 when a sonar intensity value is greater than a third predetermined sonar intensity value. Contrarily, if the sonar sensor 108 detects a sonar intensity value that is less than the third predetermined sonar intensity value, the sonar sensor 108 and the sonar sensor control circuitry 114 would determine that the wafer 106 is not present in the robotic arm 610 of the transport robot 608.

In some embodiments, the presence of the wafer 106 in the robotic arm 610 may be monitored to prevent the robotic arm 610 from picking up a different wafer when the robotic arm 610 is already carrying the wafer 106. If the robotic arm 610 attempts to pick up a different wafer when the robotic arm 610 is already carrying the wafer 106, collision between and thus, damage to the different wafer and/or the wafer 106 may occur, in some embodiments. Further, because the sound waves of the sonar sensor 108 are used to detect the presence of the wafer 106 in the transport robot 608, the sonar sensor 108 can still detect the wafer 106 if the wafer 106 comprises a transparent material.

FIGS. 7-13B illustrate cross-sectional views 700-1300B of some embodiments of a method of using a sonar sensor during a deposition process to increase the control and reliability of the deposition process. Although FIGS. 7-13B are described in relation to a method, it will be appreciated that the structures disclosed in FIGS. 7-13B are not limited to such a method, but instead may stand alone as structures independent of the method.

Figure 7:
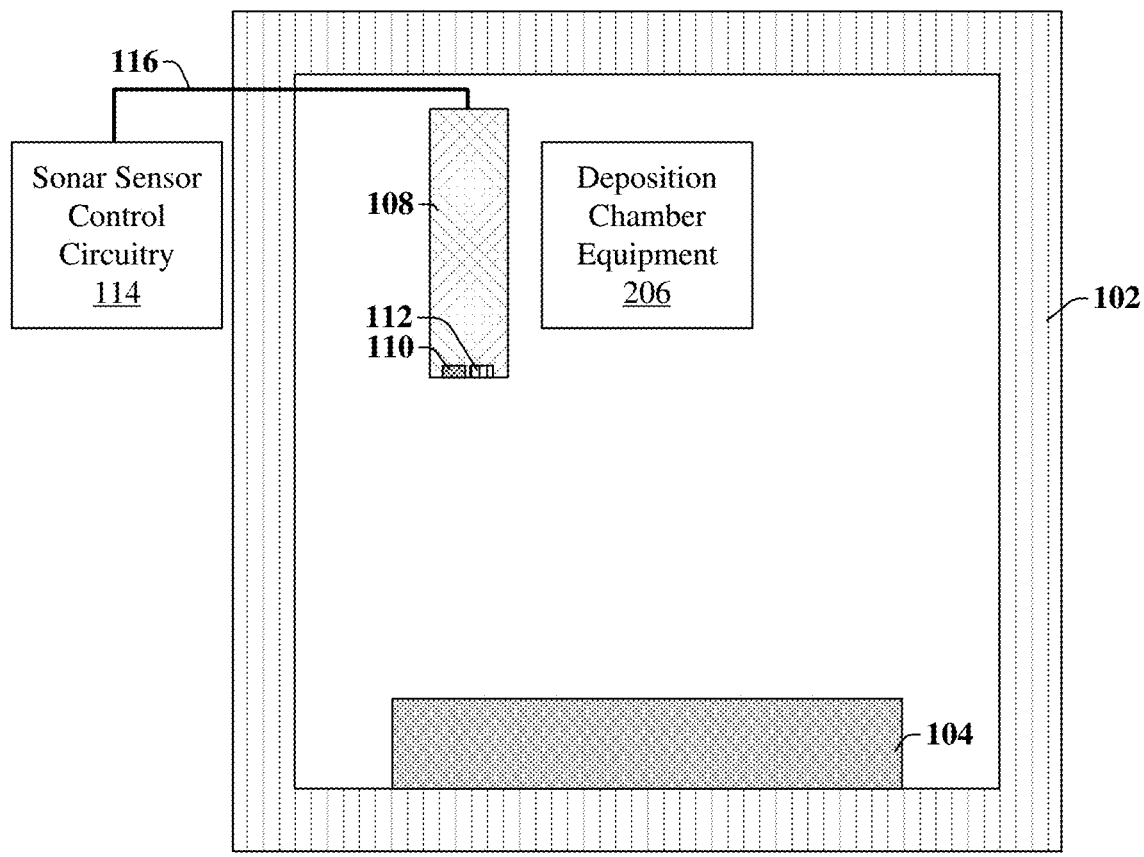
FIGS. 7-13B illustrate cross-sectional views of some embodiments of a method of using a sonar sensor within a processing chamber to detect the presence of a wafer and to detect the presence of a layer formed over the wafer to improve the reliability of a deposition process.

As shown in cross-sectional view 700 of FIG. 7, a processing chamber enclosed by a processing chamber housing 102 is provided. In some embodiments, the processing chamber may be used for deposition processes (e.g., PVD, CVD, ALD, sputtering, etc.). In such embodiments, deposition chamber equipment 206 may be arranged near a top of the processing chamber and directly overlying a wafer chuck 104 arranged near a bottom of the processing chamber. In some embodiments, the wafer chuck 104 may comprise a recess (e.g., FIGS. 5A-C). In some embodiments, the deposition chamber equipment 206 may be or comprise, for example, a material source, a shower head, or the like. In some embodiments, a sonar sensor 108 is arranged directly over the wafer chuck 104. In some embodiments, the sonar sensor 108 comprises an emitter 110 configured to emit sound waves towards the wafer chuck 104 and a detector 112 configured to receive reflected sound waves. In some embodiments, the sonar sensor 108 is coupled to sonar sensor control circuitry 114. In some embodiments, the sonar sensor control circuitry 114 is configured to analyze and determine a sonar intensity value based on the emitted and received sound waves from the emitter 110 and the detector 112, respectively, of the sonar sensor 108. In some embodiments, the sonar sensor 108 is coupled to the sonar sensor control circuitry 114 through wires 116 or wirelessly.

Figure 8:
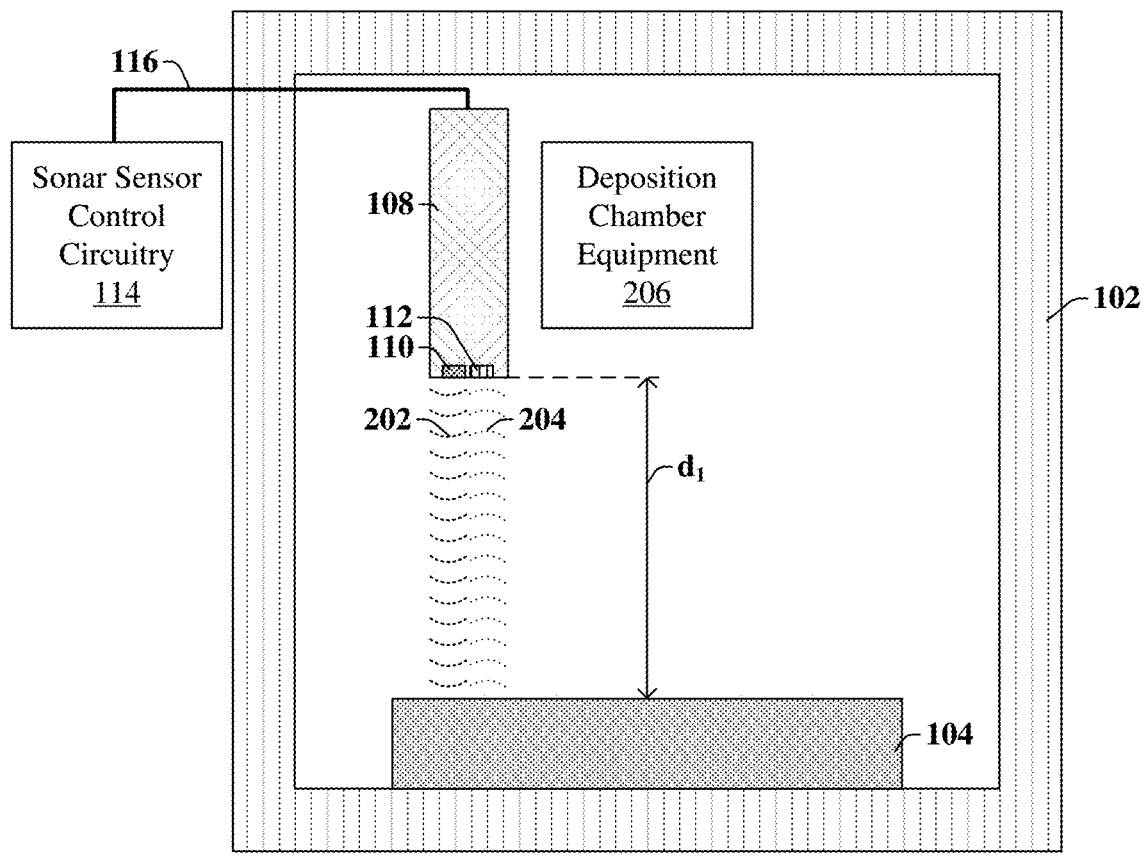

As shown in cross-sectional view 800 of FIG. 8, in some embodiments, the sonar sensor control circuitry 114 turns the sonar sensor 108 "ON" to perform a first sonar measurement process. In some embodiments, the first sonar measurement process is conducted by the emitter 110 emitting emitted sound waves 202 towards the wafer chuck 104; the emitted sound waves 202 reflecting off of the wafer chuck 104 as reflected sound waves 204; and the reflected sound waves 204 travel back towards the sonar sensor 108 and are received by the detector 112. In some embodiments, the sonar sensor control circuitry 114 measures a first sonar intensity value of the reflected sound waves 204 during the first sonar measurement process.

In some embodiments, the first sonar intensity value is a relative value that is based on a standard sonar baseline value. For example, in some instances, the first sonar intensity value is a ratio between the intensity of the reflected sound waves 204 received by the detector 112 and the standard sonar baseline value. In some embodiments, the standard sonar baseline value is a sonar intensity detected by the detector 112 when an object is at a known distance from the sonar sensor 108.

In some embodiments, the sonar sensor control circuitry 114 may analyze the first sonar intensity value and be able to determine that the first sonar intensity value corresponds to a first distance $d_1$. In some embodiments, the first distance $d_1$ is the distance between the wafer chuck 104 and the sonar sensor 108. In some embodiments, the first distance $d_1$ indicates that a previous wafer or some other workpiece is not present on the wafer chuck 104. In some embodiments, the first distance $d_1$ is compared to a first predetermined distance to determine whether a previous wafer or some other workpiece is present on the wafer chuck 104. In some embodiments, the first distance $d_1$ may be in a range of between, for example, approximately 5 centimeters to approximately 200 centimeters.

In some other embodiments, the first sonar intensity value is compared to a first predetermined sonar intensity value by the sonar sensor control circuitry 114 to determine whether a previous wafer or some other workpiece is present on the wafer chuck 104. In some embodiments, if the first sonar intensity value is greater than the first predetermined sonar intensity value, the sonar sensor control circuitry 114 may conclude that an object, such as the previous wafer or some other workpiece, is in fact arranged between the wafer chuck 104 and the sonar sensor 108. In such embodiments, wherein the first sonar intensity value is less than the first predetermined sonar intensity value, the sonar sensor control circuitry 114 may conclude that a previous wafer or some other workpiece is not present on the wafer chuck 104.

Figure 9A:
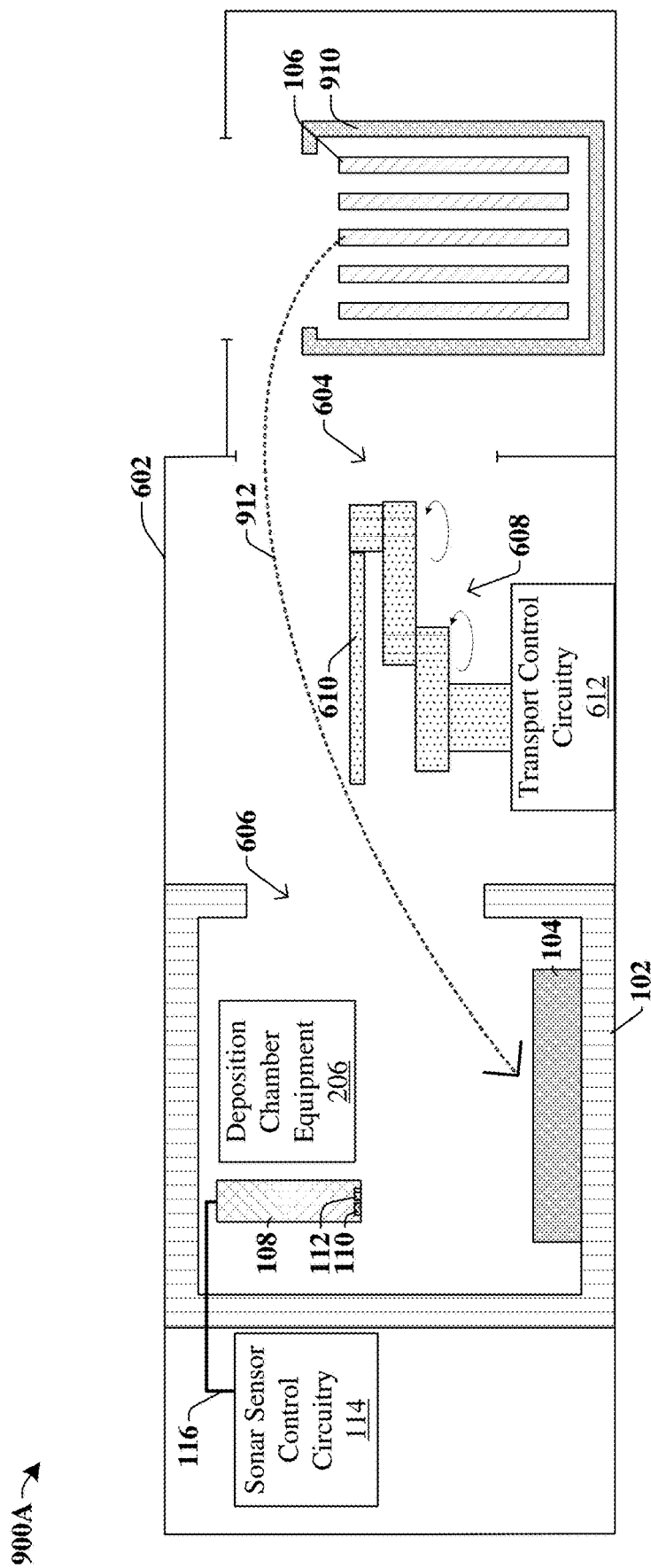

In some embodiments, if the sonar sensor 108 and sonar sensor control circuitry 114 determine that a previous wafer or some other workpiece is present on the wafer chuck 104 (not shown), the method may proceed with removing the previous wafer or the some other workpiece between the steps of FIG. 7 and FIG. 9A.

In some embodiments, the first sonar measurement process may in fact be a calibration process to determine the standard sonar baseline value. In yet other embodiments, a separate calibration process of the sonar sensor 108 may be conducted using a different object than the wafer chuck 104 to determine the standard sonar baseline value. In some embodiments, the calibration process is conducted prior to the first sonar measurement process.

As shown in cross-sectional view 900A of FIG. 9A, in some embodiments after the first sonar measurement process determines that a previous wafer or workpiece are not present on the wafer chuck 104, a wafer 106 may be transported 912 onto the wafer chuck 104. In some embodiments, a tool housing 801 comprises the processing chamber housing 102, a transport robot 608, and workpiece storage chamber 910. In some embodiments, the transport robot 608 comprises a robotic arm 610, is configured to move three-dimensionally, and is controlled by and coupled to transport control circuitry 612. In some embodiments, the workpiece storage chamber 910 comprises, for example, a front opening unified pod (FOUP), a wafer cassette, or the like and is configured to hold one or more workpieces, such as wafers 106. In some embodiments, the transport robot 608 is configured to transport 912 the wafer 106 from the workpiece storage chamber 910 through a first opening 604 in the tool housing 602 to the wafer chuck 104 through a second opening 606 in the tool housing 602/processing chamber housing 102. In some embodiments, it is the robotic arm 610 of the transport robot 608 that securely grabs the wafer 106 without damaging the wafer 106 during the transport 912.

Further, in some other embodiments, a transport sonar measurement process may be conducted before and/or after the transport 912 of the wafer 106 from the workpiece storage chamber 910 to the wafer chuck 104. In such embodiments, another sonar sensor (e.g., 108 of FIG. 6) may be present on the transport robot 608 (e.g., FIG. 6) to detect whether the transport robot 608 is already holding a previous wafer before picking up the wafer 106 from the workpiece storage chamber 910.

Figure 9B:
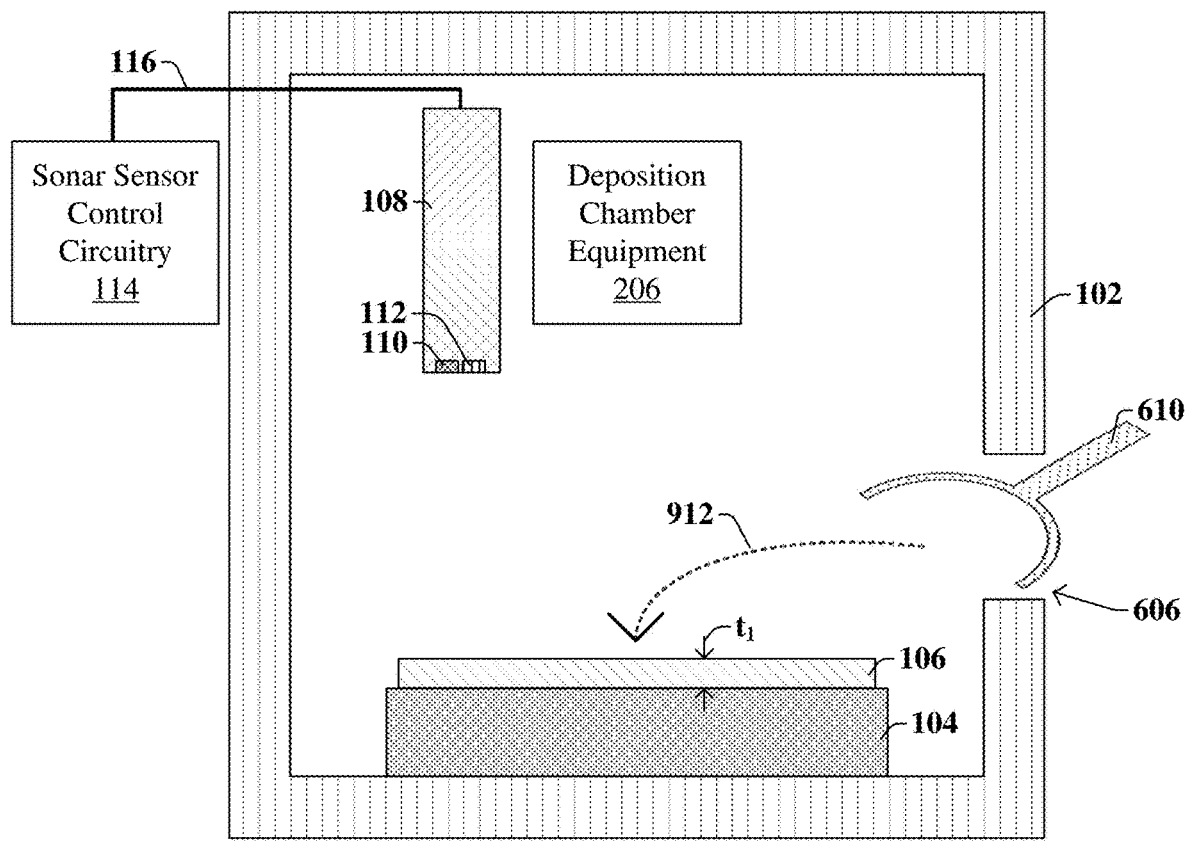

FIG. 9B illustrates a cross-sectional view 900B of a simplified version of the steps described in the cross-sectional view 900A of FIG. 9A.

As shown in the cross-sectional view 900B of FIG. 9B, in some embodiments, the robotic arm 610 transports 912 the wafer 106 to the wafer chuck 104 through the second opening 606 of the processing chamber housing 102. In some embodiments, the wafer 106 may have a first thickness $t_1$. Further, in some embodiments, the wafer 106 may be or comprise a transparent material. For example, in some embodiments, the wafer 106 may comprise, for example, fused silica, silicon nitride, silicon dioxide, a polymeric material, or some other suitable transparent material. In some other embodiments, the wafer 106 may comprise a non-transparent (i.e., opaque or translucent) material such as, for example, silicon, germanium, or the like.

In some embodiments, by performing the first sonar measurement process in FIG. 8, the wafer 106 in FIG. 9B is arranged directly on the wafer chuck 104. In other words, the first sonar measurement process in FIG. 8 ensures that a previous wafer or any previous workpiece was not on the wafer chuck 104, such that the wafer 106 may be properly loaded on the wafer chuck 104 in FIGS. 9A and 9B.

Figure 10:
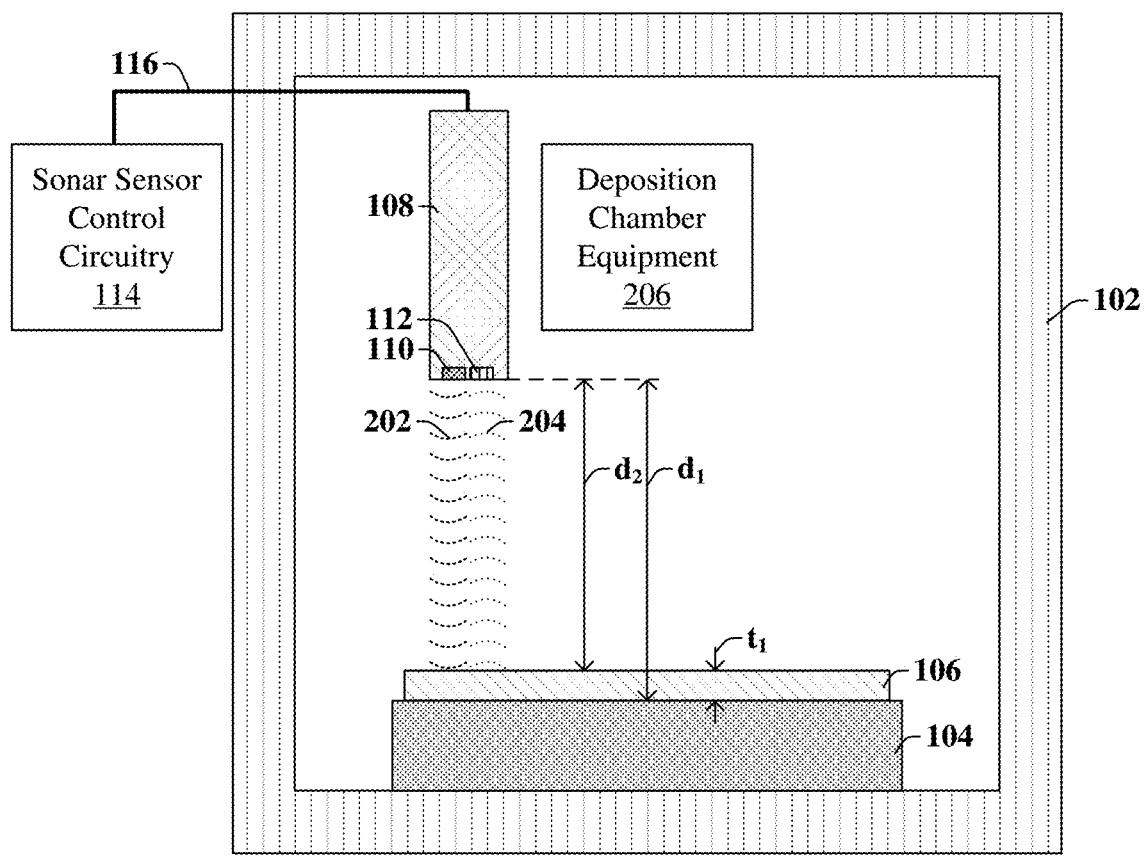

As shown in cross-sectional view 1000 of FIG. 10, in some embodiments, the processing chamber housing 102 is closed, and the sonar sensor control circuitry 114 turns the sonar sensor 108 "ON" to perform a second sonar measurement process. In some embodiments, the second sonar measurement process is conducted by the emitter 110 emitting emitted sound waves 202 towards the wafer chuck 104; the emitted sound waves 202 reflecting off of the wafer 106 as reflected sound waves 204; and the reflected sound waves 204 travel back towards the sonar sensor 108 and are received by the detector 112. In some embodiments, the sonar sensor control circuitry 114 measures a second sonar intensity value of the reflected sound waves 204 during the second sonar measurement process.

In some embodiments, the sonar sensor control circuitry 114 may analyze the second sonar intensity value and be able to determine that the second sonar intensity value corresponds to a second distance $d_2$. In some embodiments, the second distance $d_2$ is the distance between the wafer 106 and the sonar sensor 108. In some embodiments, the second distance $d_2$ indicates that the wafer 106 is present on the wafer chuck 104. In some other embodiments, the second distance $d_2$ is compared to the first predetermined distance, and the sonar sensor control circuitry 114 may conclude that the wafer 106 is present on the wafer chuck 104.

In some other embodiments, the second sonar intensity value is compared to the first predetermined sonar intensity value by the sonar sensor control circuitry 114 to verify that the wafer 106 is on the wafer chuck 104. In some embodiments, if the second sonar intensity value is greater than the first predetermined sonar intensity value, the sonar sensor control circuitry 114 may conclude that the wafer 106 is in fact arranged on the wafer chuck 104. In some other embodiments, the second sonar intensity value is compared to the first intensity value. In such embodiments, because the second sonar intensity value is greater than the first intensity value, the sonar sensor control circuitry 114 may conclude that the wafer 106 is present on the wafer chuck 104. Because the sonar sensor 108 is used, even if the wafer 106 comprises a transparent material, the presence of the wafer 106 over the wafer chuck 104 may still be determined by the second sonar measurement process.

Further, in some embodiments, a difference between the first and second sonar intensity values and/or a difference between the first and second distances $d_1$, $d_2$ may be analyzed by the sonar sensor control circuitry 114 to determine the first thickness $t_1$ of the wafer 106. In some embodiments, the first thickness $t_1$ of the wafer 106 is in a range of between, for example, approximately 100 micrometers and approximately 1000 micrometers.

In some embodiments, if the second sonar intensity value is less than the first predetermined sonar intensity value, the sonar sensor control circuitry 114 may conclude that the wafer 106 is not arranged on the wafer chuck 104. In such embodiments, the transportation steps in FIGS. 9A and 9B may be repeated to transport (912 of FIG. 9A) the wafer 106 onto the wafer chuck 104. After the transportation steps in FIGS. 9A and 9B, the second sonar measurement process of FIG. 10 may be repeated to ensure that the wafer 106 was transported (912 of FIG. 9A) onto the wafer chuck 104.

Figure 11:
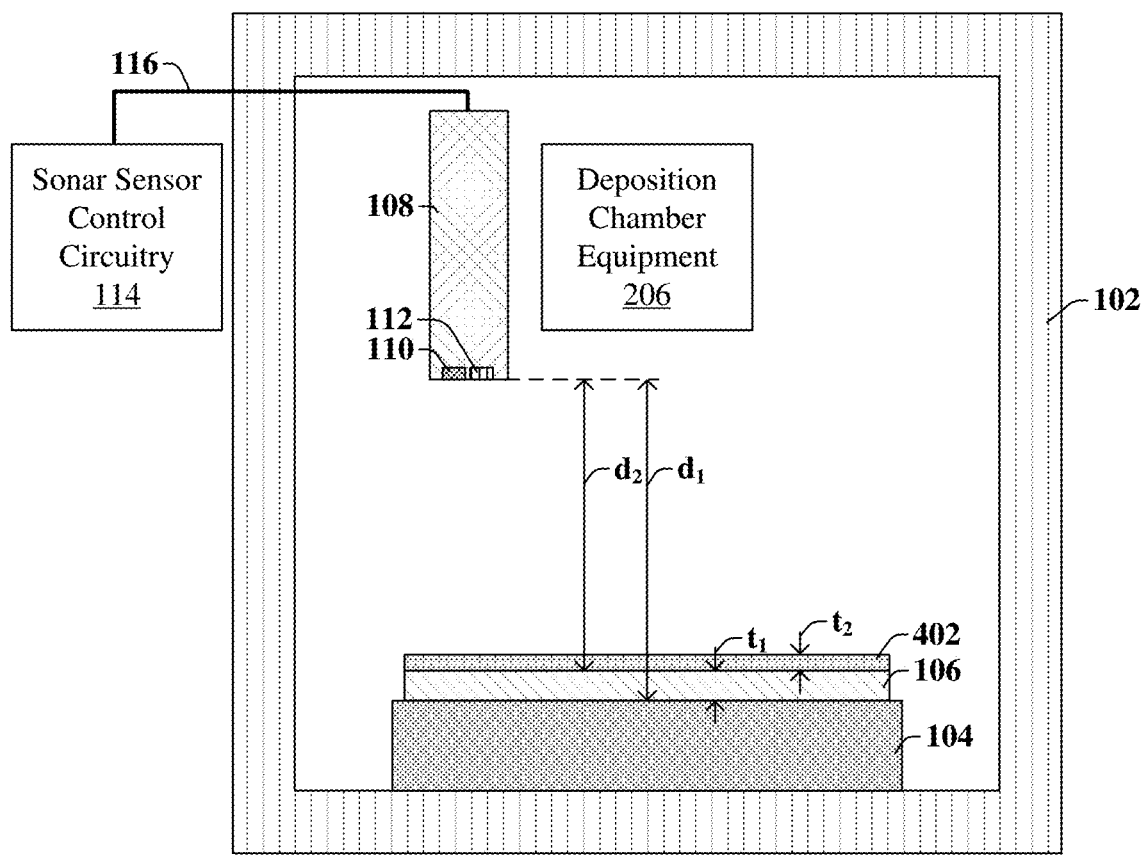

As shown in cross-sectional view 1100 of FIG. 11, in some embodiments, the deposition chamber equipment may be used to perform a deposition process to form a layer 402 over the wafer 106. In some embodiments, the deposition process may include for example, PVD, CVD, ALD, sputtering, a spin-on process, or some other suitable deposition process.

In some embodiments, after the deposition process, the layer 402 is formed over the wafer 106 have a second thickness $t_2$. In some embodiments, the layer 402 may comprise a transparent material such as, for example, fused silica, silicon nitride, silicon dioxide, a polymeric material, or some other suitable transparent material. In some other embodiments, the layer 402 may comprise a non-transparent (i.e., opaque or translucent) material such as, for example, silicon, germanium, a dielectric material, a metallic material, or the like.

Figure 12:
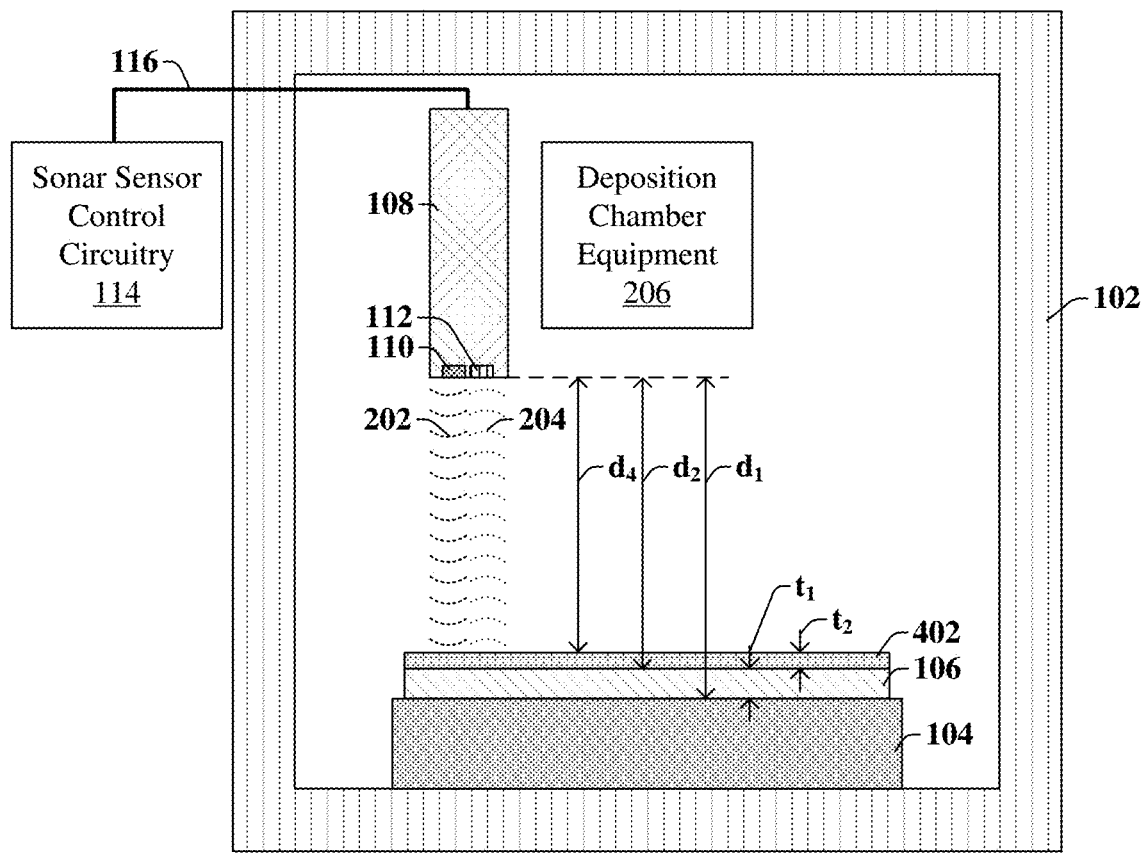

As shown in cross-sectional view 1200 of FIG. 12, in some embodiments, the sonar sensor control circuitry 114 turns the sonar sensor 108 "ON" to perform a third sonar measurement process. In some embodiments, the third sonar measurement process is conducted by the emitter 110 emitting emitted sound waves 202 towards the wafer chuck 104;

the emitted sound waves 202 reflecting off of the layer 402 as reflected sound waves 204; and the reflected sound waves 204 travel back towards the sonar sensor 108 and are received by the detector 112. In some embodiments, the sonar sensor control circuitry 114 measures a third sonar intensity value of the reflected sound waves 204 during the third sonar measurement process.

In some embodiments, the sonar sensor control circuitry 114 may analyze the third sonar intensity value and be able to determine that the third sonar intensity value corresponds to a fourth distance $d_4$. In some embodiments, the fourth distance $d_4$ is the distance between the layer 402 and the sonar sensor 108. In some embodiments, the fourth distance $d_4$ indicates that the layer 402 was formed on the wafer 106. In some other embodiments, the fourth distance $d_4$ is compared to a second predetermined distance, and the sonar sensor control circuitry 114 may conclude that the layer 402 was formed over the wafer 106.

In some other embodiments, the third sonar intensity value is compared to a second predetermined sonar intensity value by the sonar sensor control circuitry 114 to verify that the second thickness $t_2$ of the layer 402 is suitable. In some embodiments, if the third sonar intensity value is greater than the second predetermined sonar intensity value, the sonar sensor control circuitry 114 may conclude that the layer 402 is thick enough and that the deposition process may be stopped. In some embodiments, if the third sonar intensity value is less than the second predetermined sonar intensity value, the sonar sensor control circuitry 114 may conclude that the layer 402 is not yet thick enough and that the deposition process may proceed.

In yet some other embodiments, the third sonar intensity value is compared to the second intensity value and/or the fourth distance $d_4$ is compared to the second distance $d_2$ by the sonar sensor control circuitry 114 to determine the second thickness $t_2$ of the layer 402. Because the sonar sensor 108 is used, even if the layer 402 comprises a transparent material, the presence and/or the second thickness $t_2$ of the layer may still be determined by the third sonar measurement process.

Figure 13A:
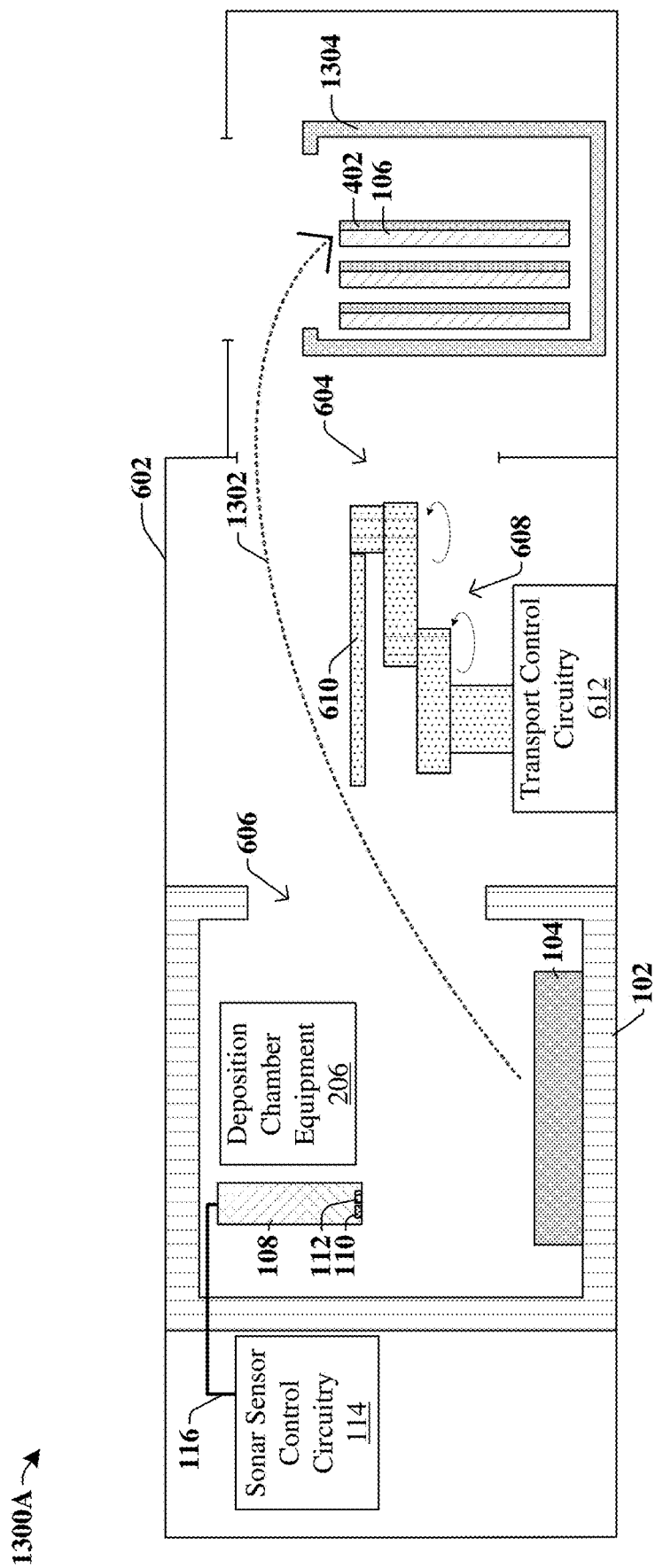

As shown in cross-sectional view 1300A of FIG. 13A, in some embodiments, after the deposition process is verified as complete by the third sonar measurement process, the wafer 106 may be removed from the processing chamber housing 102. In some embodiments, the transport robot 608 will transport 1302 the wafer 106 out of the processing chamber housing 102 and into a workpiece storage chamber 1304. In some embodiments, the workpiece storage chamber 1304 of FIG. 13A is different than the workpiece storage chamber 910 of FIG. 9A, whereas in other embodiments, the workpiece storage chamber 1304 of FIG. 13A is the same as the workpiece storage chamber 910 of FIG. 9A. In some embodiments, the wafer 106 may then be transported again from the workpiece storage chamber 1304 to some other processing chamber for more processing steps. In some other embodiments, the transport robot 608 may transfer the wafer 106 directly from the processing chamber housing 102 to the other processing chamber, thereby bypassing the workpiece storage chamber 1304.

Further, in some other embodiments, a transport sonar measurement process may be conducted before and/or after the transport 1302 of the wafer off of the wafer chuck 104. In such embodiments, another sonar sensor (e.g., 108 of FIG. 6) may be present on the transport robot 608 (e.g., FIG. 6) to detect whether the transport robot 608 is already holding a previous wafer before picking up the wafer 106 from the wafer chuck 104.

Figure 13B:
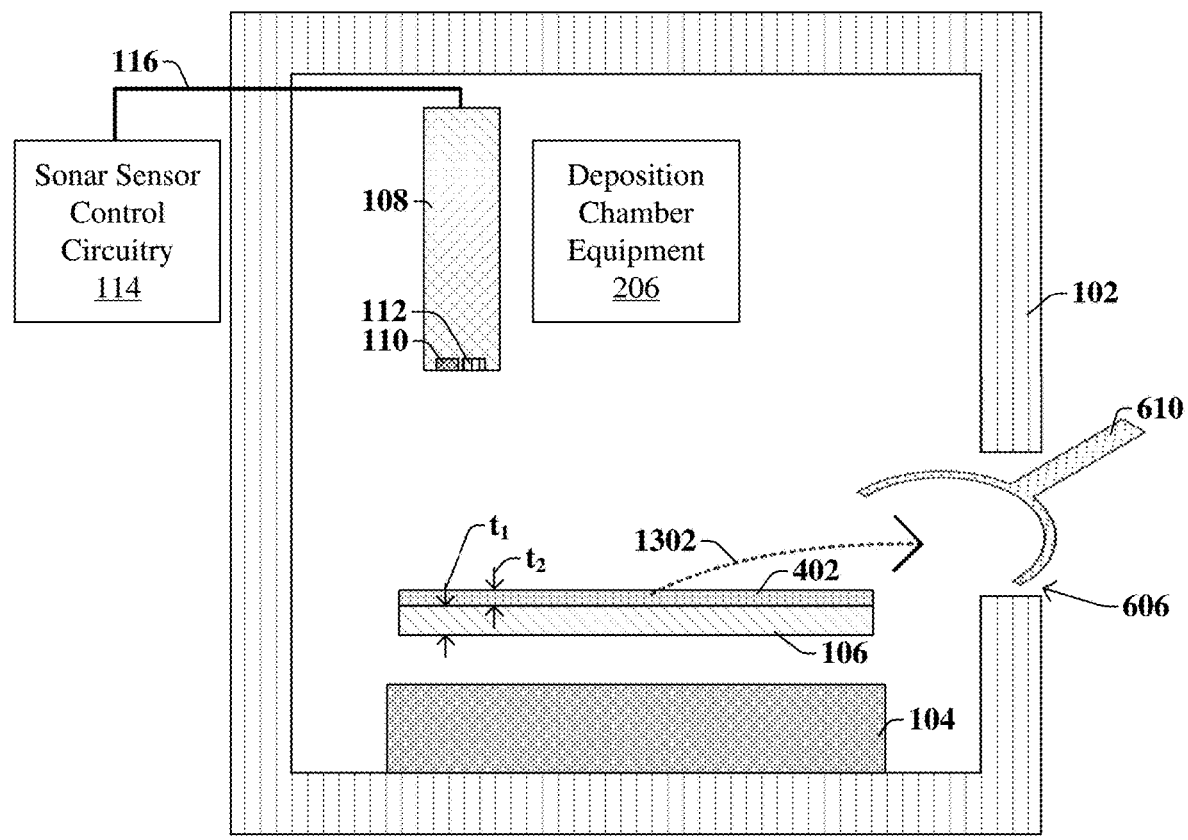

FIG. 13B illustrates a cross-sectional view 1300B of a simplified version of the steps described in the cross-sectional view 1300A of FIG. 13A.

As shown in the cross-sectional view 1300B of FIG. 13B, in some embodiments, the robotic arm 610 transports 1302 the wafer 106 off of the wafer chuck 104 and out of the processing chamber housing 102 through the second opening 606 of the processing chamber housing 102. Because the sonar sensor 108 monitored various steps of the deposition process conducted in FIGS. 7-13B, errors occurring during the deposition of the layer 402 are mitigated. Further, the sonar sensor 108 may increase the controllability of the formation of the layer 402; for example, in some embodiments, the sonar sensor 108 aids in controlling the second thickness $t_2$ of the layer 402.

Figure 14:
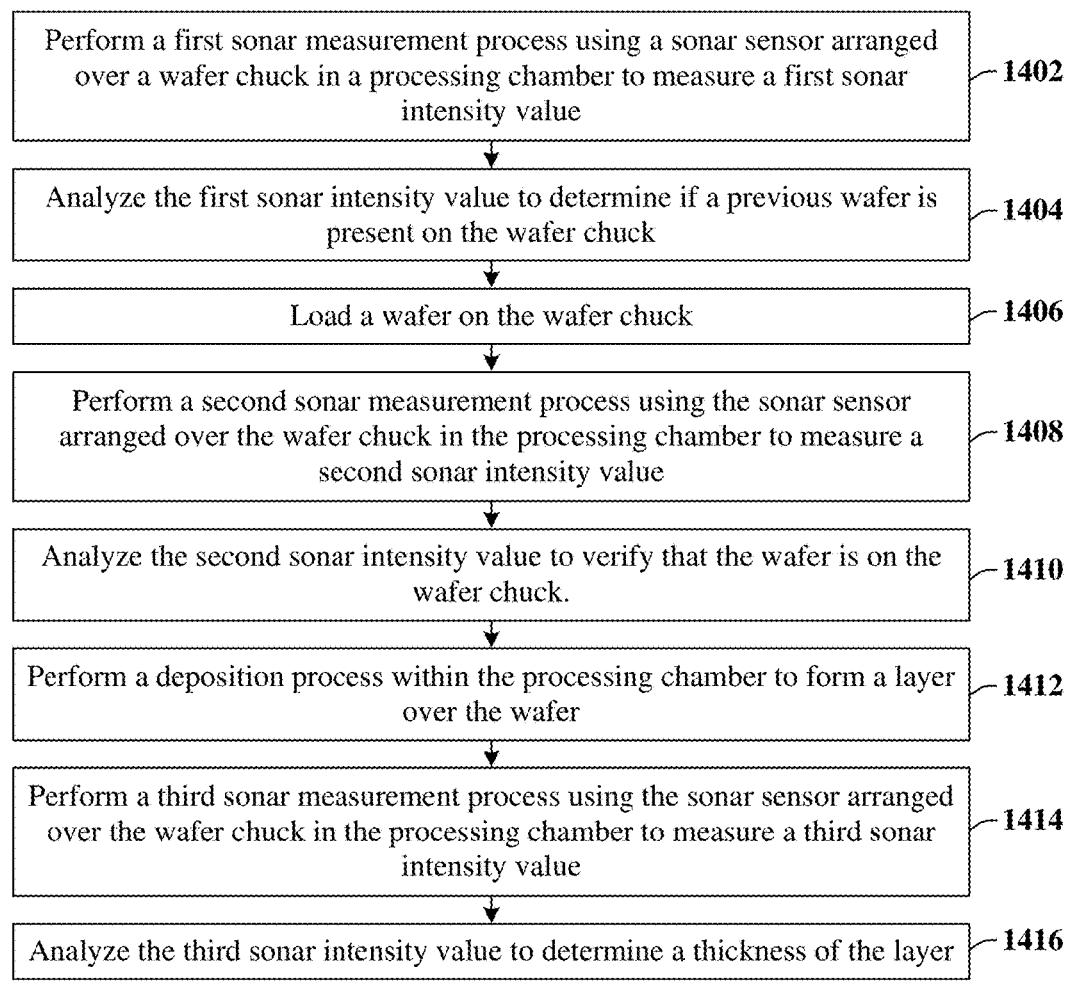
FIG. 14 illustrates a flow diagram of some embodiments of a method corresponding to the method illustrated in FIGS. 7-13B.

FIG. 14 illustrates a flow diagram of some embodiments of a method 1400 corresponding to the method illustrated in FIGS. 7-13B.

While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, a first sonar measurement process is performed using a sonar sensor arranged over a wafer chuck in a processing chamber to measure a first sonar intensity value.

At act 1404, the first sonar intensity value is analyzed to determine if a previous wafer is present on the wafer chuck. FIG. 8 illustrates a cross-sectional view 800 of some embodiments corresponding to acts 1402 and 1404.

At act 1406, a wafer is loaded on the wafer chuck. FIGS. 9A and 9B illustrate cross-sectional views 900A and 900B, respectively, of some embodiments corresponding to act 1406.

At act 1408, a second sonar measurement process is performed using the sonar sensor arranged over the wafer chuck in the processing chamber to measure a second sonar intensity value.

At act 1410, the second sonar intensity value is analyzed to verify that the wafer is on the wafer chuck. FIG. 10 illustrates a cross-sectional view 1000 of some embodiments corresponding to acts 1408 and 1410.

At act 1412, a deposition process is performed within the processing chamber to form a layer over the wafer. FIG. 11 illustrates a cross-sectional view 1100 of some embodiments corresponding to act 1412.

At act 1414, a third sonar measurement process is performed using the sonar sensor arranged over the wafer chuck in the processing chamber to measure a third sonar intensity value.

At act 1416, the third sonar intensity value is analyzed to determine a thickness of the layer. FIG. 12 illustrates a cross-sectional view 1200 of some embodiments corresponding to acts 1414 and 1416.

Therefore, the present disclosure relates to a method of using a sonar sensor to detect the presence of and/or to analyze objects within a processing chamber to increase the control and reliability of various processing steps for semiconductor manufacturing.

Accordingly, in some embodiments, the present disclosure relates to process tool, comprising: a chamber housing defining a processing chamber; a workpiece holder apparatus arranged within the processing chamber and configured to hold a workpiece; a sonar sensor arranged over the workpiece holder apparatus and comprising: an emitter configured to produce sound waves traveling towards the workpiece holder apparatus, and a detector configured to receive reflected sound waves from the workpiece holder apparatus or an object between the sonar sensor and the workpiece holder apparatus; and sonar sensor control circuitry coupled to the sonar sensor and configured to determine if the workpiece is present on the workpiece holder apparatus based on a sonar intensity value of the reflected sound waves received by the detector of the sonar sensor.

In other embodiments, the present disclosure relates to a method comprising: performing a first sonar measurement process on an object within a processing chamber using a sonar sensor arranged within the processing chamber to measure a first sonar intensity value; and comparing the first sonar intensity value to a predetermined sonar intensity value, wherein if the first sonar intensity value is greater than the predetermined sonar intensity value, the method proceeds with a first set of processing steps, and wherein if the first sonar intensity value is less than the predetermined sonar intensity value, the method proceeds with a second set of processing steps.

In yet other embodiments, the present disclosure relates to a method comprising: performing a first sonar measurement process using a sonar sensor arranged over a workpiece holder apparatus in a processing chamber to measure a first sonar intensity value; analyzing the first sonar intensity value to determine if a previous workpiece is present on the workpiece holder apparatus; loading a workpiece on the workpiece holder apparatus; performing a second sonar measurement process using the sonar sensor arranged over the workpiece holder apparatus in the processing chamber to measure a second sonar intensity value; and analyzing the second sonar intensity value to verify that the workpiece is on the workpiece holder apparatus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process tool, comprising:
a chamber housing defining a processing chamber;
a workpiece holder apparatus arranged within the processing chamber and configured to hold a workpiece, the workpiece holder apparatus including a wafer chuck;
a sonar sensor arranged directly over a center of the wafer chuck when viewed from a side view, and comprising: an emitter configured to produce sound waves traveling towards the workpiece holder apparatus, and a detector configured to receive reflected sound waves from the workpiece holder apparatus or an object between the sonar sensor and the workpiece holder apparatus; and
sonar sensor control circuitry coupled to the sonar sensor and configured to determine if the workpiece is present on the workpiece holder apparatus based on a sonar intensity value of the reflected sound waves received by the detector of the sonar sensor.

2. The process tool of claim 1, wherein the workpiece holder apparatus comprises a robotic arm that is configured to move in three dimensions.

3. The process tool of claim 1, wherein the wafer chuck comprises peripheral portions surrounding a center portion, and wherein when the wafer chuck is holding the workpiece, the workpiece directly contacts the peripheral portions and is spaced apart from the center portion in a vertical direction.

4. The process tool of claim 1, wherein the workpiece comprises a transparent material.

5. The process tool of claim 1, further comprising:
a transport robot configured to place the workpiece on the workpiece holder apparatus, wherein the transport robot includes a second sonar sensor.

6. The process tool of claim 1, wherein the sonar sensor control circuitry is configured to determine a thickness of the workpiece based on the sonar intensity value of the reflected sound waves received by the detector the sonar sensor.

7. A method comprising:
performing a deposition process;
while performing the deposition process, performing a first sonar measurement process on an object within a processing chamber using a sonar sensor arranged within the processing chamber to measure a first sonar intensity value; and
comparing the first sonar intensity value to a predetermined sonar intensity value,
wherein if the first sonar intensity value is greater than the predetermined sonar intensity value, the method proceeds with a first set of processing steps, and
wherein if the first sonar intensity value is less than the predetermined sonar intensity value, the method proceeds with a second set of processing steps.

8. The method of claim 7, wherein the object is a transparent layer formed on a workpiece by the deposition process within the processing chamber, wherein the first sonar intensity value corresponds to a thickness of the transparent layer, wherein the first set of processing steps comprise stopping the deposition process and removing the workpiece from the processing chamber, and wherein the second set of processing steps comprise continuing the deposition process to increase the thickness of the transparent layer.

9. The method of claim 7, wherein the first sonar intensity value corresponds to a distance between the sonar sensor and the object within the processing chamber.

10. The method of claim 7, wherein the object within the processing chamber is a wafer alignment mark arranged on a transparent wafer.

11. The method of claim 7, further comprising:
performing a sonar measurement process before the deposition process to measure a sonar intensity value, wherein the sonar intensity value indicates if a previous workpiece is present on a workpiece holder apparatus within the processing chamber; and
responsive to the previous workpiece being present, removing the previous workpiece from the workpiece holder apparatus, and loading a workpiece onto the workpiece holder apparatus.

12. The method of claim 11, wherein the previous workpiece and the workpiece comprise transparent materials.

13. A method comprising:
performing a first sonar measurement process using a sonar sensor arranged over a workpiece holder apparatus in a processing chamber to measure a first sonar intensity value;
analyzing the first sonar intensity value to determine if a previous workpiece is present on the workpiece holder apparatus by comparing the first sonar intensity value to a first predetermined sonar intensity value;
responsive to the previous workpiece not being present, loading a workpiece on the workpiece holder apparatus, wherein the previous workpiece is different from the workpiece;
performing a second sonar measurement process using the sonar sensor arranged over the workpiece holder apparatus in the processing chamber to measure a second sonar intensity value; and
analyzing the second sonar intensity value to verify that the workpiece is on the workpiece holder apparatus.

14. The method of claim 13,
wherein a thickness of the workpiece is based on a difference between the first sonar intensity value and the second sonar intensity value.

15. The method of claim 13, wherein the first sonar intensity value is less than the second sonar intensity value.

16. The method of claim 13, wherein the performing of the first and second sonar measurement processes and the analyzing of the first and second sonar intensity values are conducted using sonar sensor control circuitry coupled to the sonar sensor.

17. The method of claim 13, wherein if the first sonar intensity value indicates that the previous workpiece is present on the workpiece holder apparatus, then before the workpiece is loaded on the workpiece holder apparatus, the method further comprises:
removing the previous workpiece from the workpiece holder apparatus.

18. The method of claim 13, further comprising:
performing a deposition process within the processing chamber to form a layer over the workpiece.

19. The method of claim 18, further comprising:
performing a third sonar measurement process using the sonar sensor arranged over the workpiece holder apparatus in the processing chamber to measure a third sonar intensity value; and
analyzing the third sonar intensity value to determine a thickness of the layer.

20. The method of claim 19, wherein the thickness of the layer is based on a difference between the second sonar intensity value and the third sonar intensity value.

* * * * *